(12) United States Patent
Krönke et al.

(10) Patent No.: US 7,183,188 B2
(45) Date of Patent: Feb. 27, 2007

(54) METHOD FOR FABRICATING CONTACT-MAKING CONNECTIONS

(75) Inventors: Matthias Krönke, Dresden (DE); Joachim Patzer, Dessau (DE)

(73) Assignee: Infineon Technologies AG, Munich (DE)

( * ) Notice: Subject to any disclaimer, the term of this patent is extended or adjusted under 35 U.S.C. 154(b) by 52 days.

(21) Appl. No.: 11/033,471

(22) Filed: Jan. 12, 2005

(65) Prior Publication Data
US 2005/0176239 A1 Aug. 11, 2005

(30) Foreign Application Priority Data
Jan. 13, 2004 (DE) ............... 10 2004 001 853

(51) Int. Cl.
*H01L 21/3205* (2006.01)
*H01L 21/4763* (2006.01)

(52) U.S. Cl. ............ 438/592; 438/593; 438/586; 257/E21.59; 257/E21.658

(58) Field of Classification Search ............ 438/592, 438/593, 586, 585, 258, 269, 595, 596; 257/E21.257, 257/E21.59, E21.507, E21.658
See application file for complete search history.

(56) References Cited

U.S. PATENT DOCUMENTS

| | | | |
|---|---|---|---|
| 5,534,462 A | | 7/1996 | Fiordalice et al. |
| 5,573,633 A | * | 11/1996 | Gambino et al. ............ 438/533 |
| 5,731,242 A | * | 3/1998 | Parat et al. ............ 438/586 |
| 6,008,123 A | | 12/1999 | Kook et al. |
| 6,235,593 B1 | * | 5/2001 | Huang ............ 438/279 |
| 6,235,621 B1 | * | 5/2001 | Jeng et al. ............ 438/592 |
| 6,271,087 B1 | * | 8/2001 | Kinoshita et al. ............ 438/258 |
| 6,326,270 B1 | * | 12/2001 | Lee et al. ............ 438/279 |
| 6,475,847 B1 | * | 11/2002 | Ngo et al. ............ 438/201 |
| 6,790,765 B1 | * | 9/2004 | Huang et al. ............ 438/622 |

FOREIGN PATENT DOCUMENTS

| | | |
|---|---|---|
| DE | 10053467 A1 | 5/2002 |
| DE | 10042932 C2 | 8/2002 |
| EP | 0764974 A1 | 3/1997 |

* cited by examiner

*Primary Examiner*—Walter L. Lindsay, Jr.
(74) *Attorney, Agent, or Firm*—Morrison & Foerster LLP

(57) ABSTRACT

The invention provides a method for fabricating contact-making connections, having the steps of: a) providing a substrate (101) with electronic circuit units (102*a*, 102*b*) arranged thereon, an intermediate layer (103) filling an interspace between the electronic circuit units (102*a*, 102*b*); an insulation layer (104) being deposited on the electronic circuit units (102*a*, 102*b*) and on the intermediate layer (103); a masking layer (105) being deposited on the insulation layer (104); and the masking layer (105) being patterned with a through-plating structure (106); b) patterning a contact-making region by means of the masking layer (105), a contact-making hole (112) being etched through the insulation layer (104) and the intermediate layer (103) as far as the substrate (101), a section of the substrate (101) being uncovered in accordance with the through-plating structure (106); c) filling the contact-making hole (112) with a through-plating material (108); d) polishing back the covering layer (107) deposited on the masking layer (105) as far as the masking layer (105); e) depositing a contact-making layer (109) on the masking layer (105) and the through-plating material, the contact-making layer (109) being electrically contact-connected with the through-plating material (108); and f) patterning the contact-making layer (109) together with the residual masking layer (105) in accordance with a structure of a contact-making layer mask (111) applied to the contact-making layer (109) in order to form interconnects as contact-making connections in a metallization plane (M).

11 Claims, 6 Drawing Sheets ical field of the invention

METHOD FOR FABRICATING CONTACT-MAKING CONNECTIONS

CLAIM FOR PRIORITY

This application claims the benefit of priority to application Ser. No. 10 2004 001 853.7, filed Jan. 13, 2004, the contents of which are hereby incorporated by reference in its entirety.

TECHNICAL FIELD OF THE INVENTION

The present invention relates generally to the fabrication of integrated electronic circuit units, and in particular to a method for fabricating contact-making connections.

BACKGROUND OF THE INVENTION

Conventional methods for fabricating contact-making connections essentially comprise providing a substrate that has electronic circuit units, depositing an intermediate layer for the purpose of filling the interspace between the electronic circuit units, depositing an insulation layer on the electronic circuit units and on the intermediate layer, and depositing a masking layer on the insulation layer.

SUMMARY OF THE INVENTION

The present invention simplifies a process for fabricating contact-making connections, a contact-making layer being improved with regard to a surface structure and a good electrical coupling to the substrate being provided at the same time.

The invention also relates to an integration concept for fabricating contact-making connections in which the implementation of a masking layer is improved compared with hard masks according to the prior art. Specifically, the invention relates to a method for fabricating contact-making connections, a substrate that has electronic circuit units being provided and the substrate being electrically connected to a metallization plane with the aid of a through-plating material.

In particular, the method according to the invention is used for information storage devices based on a deep trench technology.

One embodiment of the invention includes combining the process sequences for depositing and patterning a masking layer with an anisotropic etching process for patterning a contact-making layer in a metallization plane, for example in a zeroth metallization plane, in particular in stopping a chemical mechanical polishing process (CMP) sharply on the masking layer in such a way that the insulation layer is not damaged or deformed in terms of its surface structure.

In this case, it is advantageous that the masking layer, which may be formed as a polysilicon hard mask, is used for optimizing contact hole sizes. Furthermore, it is expedient that, on account of a dry etching process to be carried out in the metallization plane, a masking layer is provided with a layer thickness such that the masking layer is preserved during a subsequent polishing process for removing a covering layer. Consequently, it is advantageous that two process sequences can be combined by modifying the layer thickness of the hard mask.

In one embodiment, the method according to the invention for fabricating contact-making connections essentially includes:

a) providing a substrate with electronic circuit units arranged thereon:
   an intermediate layer filling an interspace between the electronic circuit units;
   an insulation layer being deposited on the electronic circuit units and on the intermediate layer;
   a masking layer being deposited on the insulation layer; and
   the masking layer being patterned with a through-plating structure;
b) patterning a contact-making region by means of the masking layer, a contact-making hole being etched through the insulation layer and the intermediate layer as far as the substrate, a section of the substrate being uncovered in accordance with the through-plating structure;
c) filling the contact-making hole with a through-plating material;
d) polishing back the covering layer deposited on the masking layer as far as the masking layer;
e) depositing a contact-making layer on the masking layer and the through-plating material, the contact-making layer being electrically contact-connected with the through-plating material; and
f) patterning the contact-making layer together with the residual masking layer in accordance with a structure of a contact-making layer mask applied to the contact-making layer in order to form interconnects as contact-making connections in a metallization plane.

In accordance with another embodiment of the present invention, after the step of filling the contact-making hole with the through-plating material, a contact-making layer is deposited on the masking layer, the contact-making layer being electrically connected to the through-plating material.

In accordance with a further preferred embodiment of the present invention, before the step of filling the contact-making hole with the through-plating material, a covering layer is deposited on that section of the substrate which is uncovered in accordance with the through-plating structure and on the masking layer.

It is advantageous that the masking layer is provided with a layer thickness such that the masking layer is preserved during a polishing process for removing the covering layer.

In accordance with yet another preferred embodiment of the present invention, the contact-making layer is patterned together with the residual masking layer in accordance with a structure of a contact-making layer mask applied to the contact-making layer in order to form interconnects as contact-making connections in a metallization plane.

In this case, it may be expedient that, during the patterning the contact-making layer together with the residual masking layer in accordance with a structure of the contact-making layer mask applied to the contact-making layer in order to form interconnects as contact-making connections in a metallization plane, provision is made of an overetching into the insulation layer lying below the masking layer.

The coating and etching processes according to the present invention are advantageously carried out in a multifrequency parallel plate reactor.

In accordance with yet another preferred embodiment of the present invention, the step of etching the at least one contact-making hole through the insulation layer and the intermediate layer as far as the substrate is carried out by means of an anisotropic etching process. It is advantageous that the anisotropic etching process is provided as a reactive ion etching (RIE).

The substrate is preferably embodied from a silicon material, and it is preferred for the substrate to comprise crystalline silicon.

In an expedient manner, the covering layer is provided on the uncovered section of the substrate made of titanium and/or titanium nitride in such a way that the covering layer forms with the silicon material of the substrate a compound titanium silicide ($Ti_xSi_y$)

Preferably, the step of etching the at least one contact-making hole through the insulation layer and the intermediate layer as far as the substrate has a high selectivity with respect to silicon nitride ($Si_xN_y$).

A deposition of the insulation layer on the electronic circuit units and on the intermediate layer is preferably provided from a tetraethyl orthosilicate (TEOS) material, a silicon dioxide layer ($SiO_2$) being applied as an insulation layer.

Preferably, the masking layer deposited on the insulation layer is provided as a polysilicon hard mask.

Furthermore, the through-plating material and the contact-making layer, which are electrically connected to one another, are formed from a tungsten material.

BRIEF DESCRIPTION OF THE DRAWINGS

Exemplary embodiments of the invention are illustrated in the drawings and explained in more detail in the description below.

In the drawings.

In the figures, identical reference symbols designate identical or functionally identical components or steps.

DETAILED DESCRIPTION OF THE INVENTION

Figure 1:
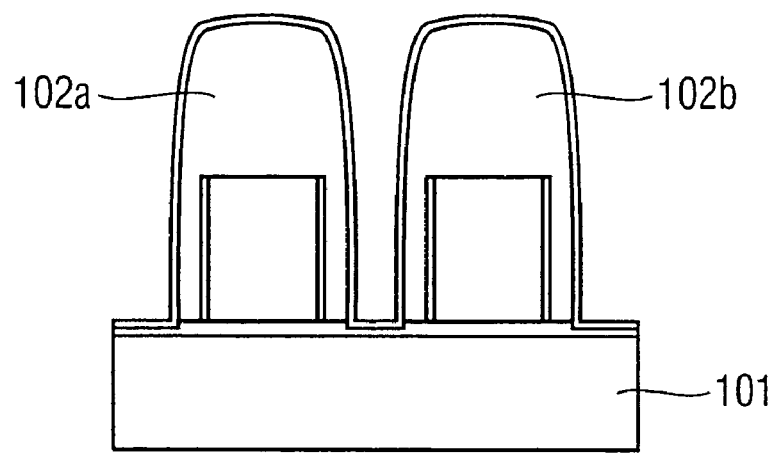
FIG. 1 shows a substrate with electronic circuit units arranged thereon in accordance with an exemplary embodiment of the present invention.

FIG. 1 shows a substrate 101 provided from a crystalline silicon material, for example. As shown diagrammatically in FIG. 1, two electronic circuit units 102a, 102b are applied on the substrate 101.

It should be pointed out that the electronic circuit units 102a, 102b shown comprise a gate oxide layer, a tungsten/tungsten nitride gate, and further layers in the form of a gate stack and also a silicon nitride material ($Si_xN_y$) as an example in order to form a circuitry functional unit as is customary to average persons skilled in the art of integrated circuits.

The precise structure of the electronic circuit units 102a, 102b will not be explained in greater detail below since it is not essential to the illustration of the method according to the invention for fabricating contact-making connections.

Figure 2:
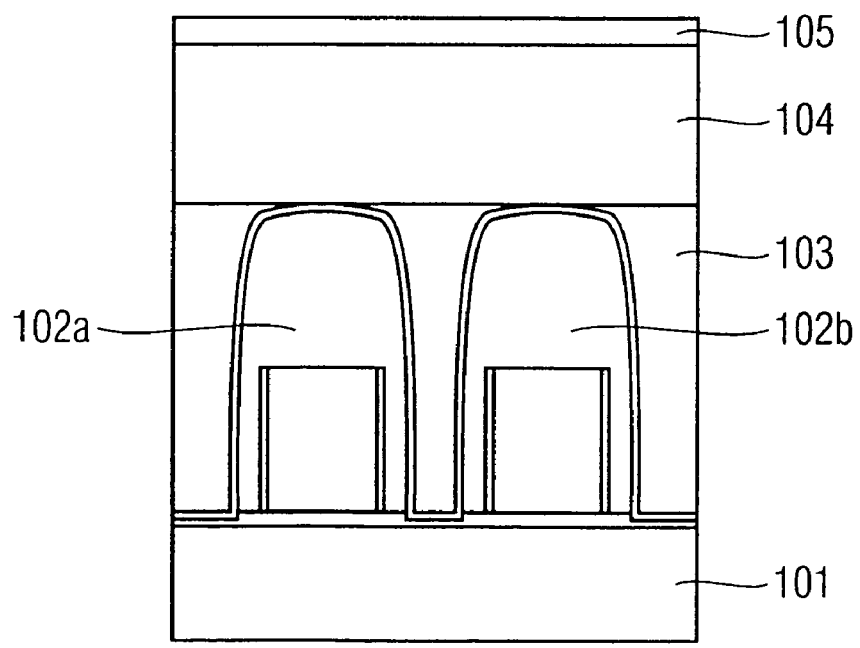
FIG. 2 shows the arrangement of FIG. 1 which is provided with an intermediate layer, an insulation layer and a hard masking layer.

As shown in FIG. 2, the arrangement shown in FIG. 1, comprising the substrate 101 and the two electronic circuit units 102a, 102b, is provided with an intermediate layer 103, which comprises borophosphorus-doped Si glass, for example, and is electrically insulating. In this case, the intermediate layer 103 serves as a filling material that terminates at the top side of the electronic circuit units 102a, 102b. Furthermore, the filling in the form of the intermediate layer 103 between the electronic circuit units 102a, 102b acts as a dielectric.

The filling material of the intermediate layer 103 is subjected to heat treatment for the purpose of closing voids and/or for the purpose of annealing the material. After a deposition of the intermediate layer 103, the latter is polished back to the stacks (GC stacks) of the electronic circuit units 102a, 102b by means of chemical mechanical polishing (CMP).

An insulation layer 104 having a layer thickness of 100 nanometers (nm), for example, is subsequently applied on a wafer that has been planarized in this way. The thickness of the insulation layer (104) is preferably between 0 and 400 nm. The insulation layer 104 acts as a further dielectric and is provided from tetraethyl orthosilicate (TEOS) material, the insulation layer being formed as a silicon dioxide layer ($SiO_2$) layer.

After a deposition in the insulation layer 104, a masking layer 105 is deposited on the insulation layer 104. The masking layer 105 preferably comprises silicon that is provided either in amorphous or polycrystalline form with a preferred thickness of 120 nm. Preferably, the layer thickness of the masking layer is 30 to 300 nm.

Figure 3:
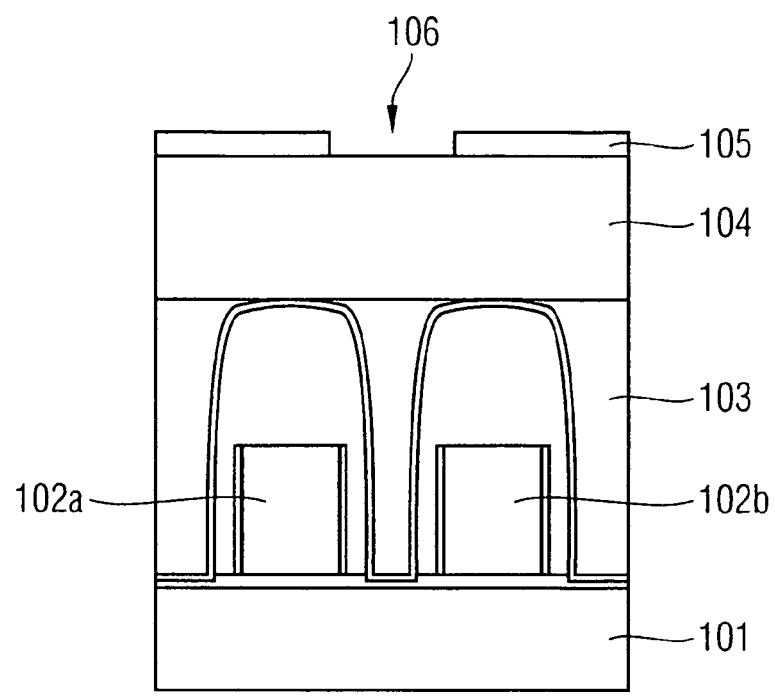
FIG. 3 shows the arrangement shown in FIG. 2, the masking layer having been provided with a through-plating structure.

FIG. 3 shows the arrangement illustrated in FIG. 2, a through-plating structure 106 being present here in the masking layer 105. The through-plating structure 106 is produced in a customary manner by coating the masking layer 105 with photoresist and exposing and developing the photoresist. The through-plating structure 106 is provided in the masking layer 105 at those locations at which contact-making holes are intended to be produced. The lithography used is preferably based on a single hard mask, but a double exposure with different masks is also possible.

Figure 4:
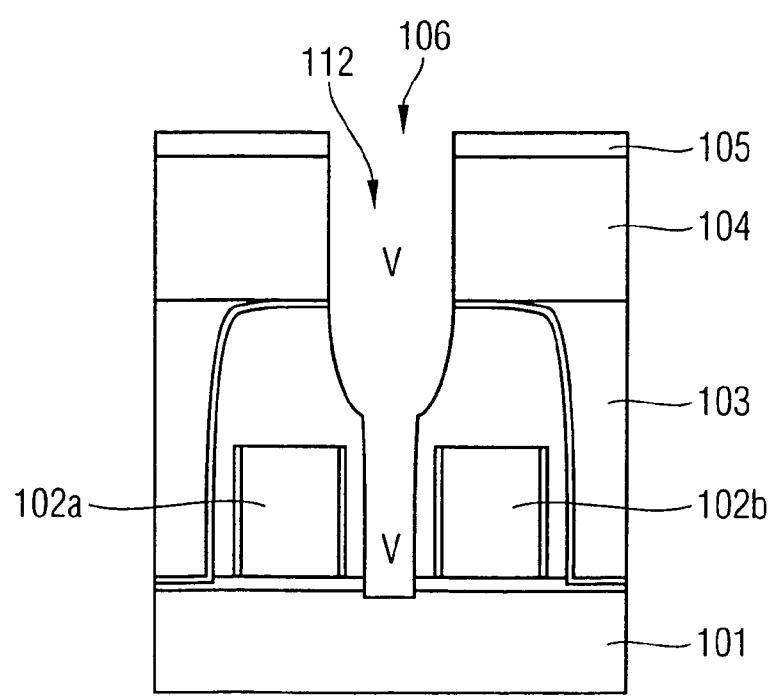
FIG. 4 shows the arrangement shown in FIG. 3 after an etching process, the through-plating structure having reached the surface of the substrate.

FIG. 4 shows the arrangement illustrated in FIG. 3 after an anisotropic dry etching process has been carried out. An etching chemical that etches silicon oxide and has a high selectivity with respect to $Si_xN_y$ (silicon nitride) is preferably used for the dry etching process. For the case where an $Si_xN_y$ or SiON liner has been used, an SiN etching is effected as termination. As illustrated in FIG. 4, a contact-making hole 112 has been etched through the insulation layer 104 and the intermediate layer 103 as far as the substrate 101 in accordance with a through-plating structure 106.

Figure 5:
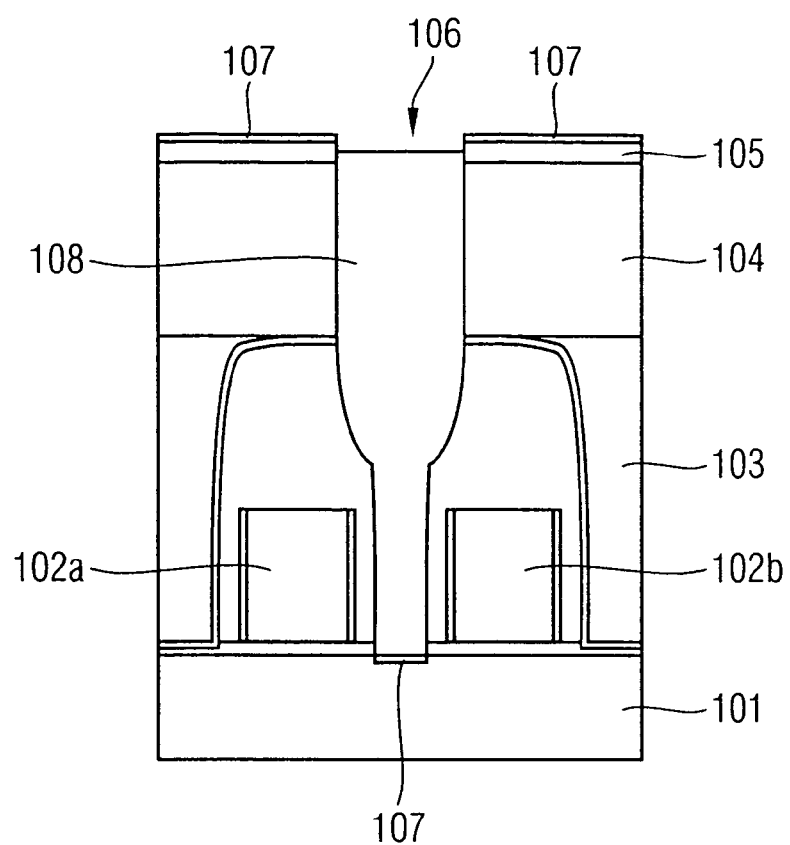
FIG. 5 shows the through-plating structure of FIG. 4 filled with a through-plating material.

The contact hole 112 is subsequently filled with a through-plating material 108, as illustrated in FIG. 5. In order to protect the substrate 101, it is possible to deposit a covering layer 107 before the step of filling the contact-making hole 112 with the through-plating material 108. The covering layer 107 preferably comprises titanium (Ti) and/or titanium nitride (TiN) and is subjected to heat treatment in a nitrogen-containing atmosphere after the deposition. In the course of a heat treatment, the titanium at the bottom of the contact hole is converted into titanium silicide ($Ti_xSi_y$) in such a way as to provide a sufficient conductivity between the substrate 101 and through-plating material 108. Through the process by which the covering layer 107 is applied on the substrate 101 at the bottom of the contact hole, a covering layer 107 of identical type is applied on the masking layer 105. The covering layer 107 applied on the masking layer 105 is subsequently removed in a chemical mechanical polishing process, so that the through-plating material 108 remains at the surface of the insulation layer 104, as shown in FIG. 6, or the masking layer 105 remains on the surface of the insulation layer 104, as shown in FIG. 7.

Figure 7:
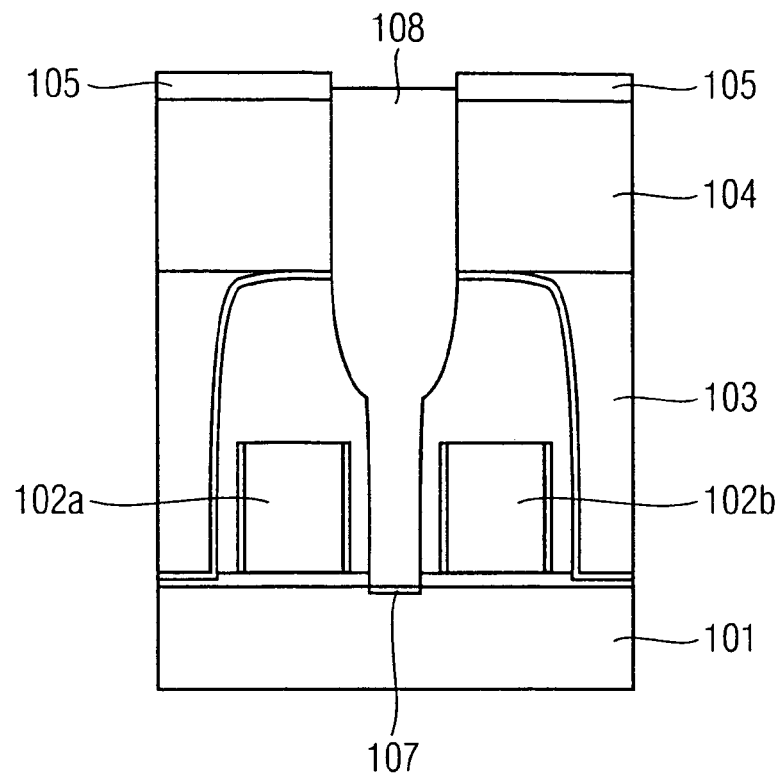
FIG. 7 shows the arrangement shown in FIG. 5, the covering layer being removed and the masking layer having remained on the top side of the insulation layer.

In one embodiment, if the method shown in FIG. 7 is employed, a chemical mechanical polishing process (CMP) stops sharply on the masking layer 105 in such a way that the insulation layer 104 is not damaged or deformed in terms of its surface structure. Furthermore, the advantage of leaving the masking layer 105 on the insulation layer 104 includes avoiding a removal step (for example an etching step) for removing the masking layer 105. A simplified process sequence is provided in this way.

The completion of the contact-making connections will be described below with reference to FIGS. 8 to 11, in which case, in order to shorten an illustration, components and steps that have already been described with reference to FIGS. 1 to 7 will not be described again.

Figure 6:
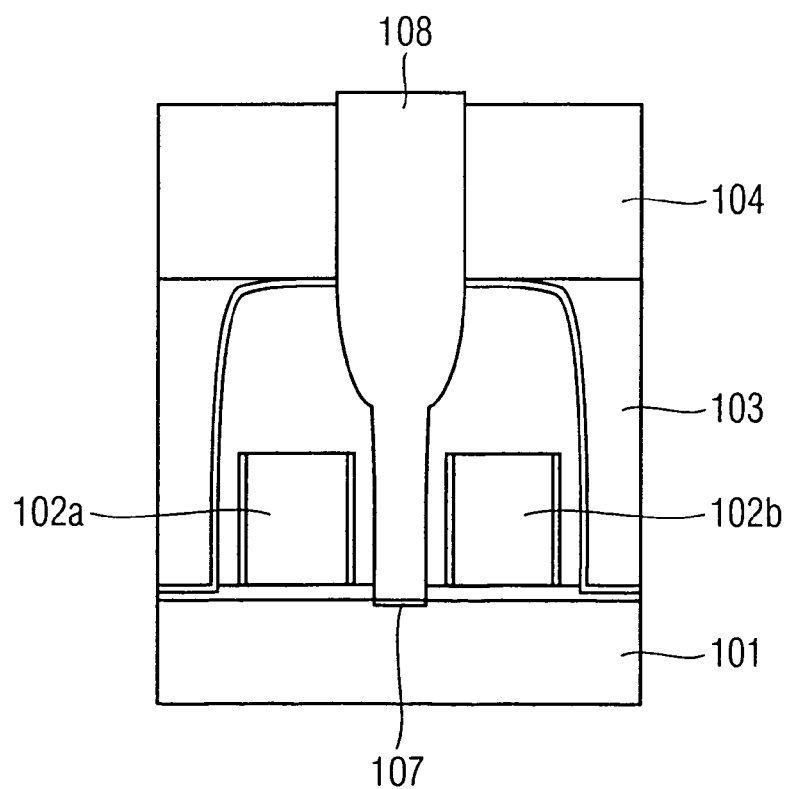
FIG. 6 shows the arrangement shown in FIG. 5, a covering layer used and the masking layer being removed on the top side of the insulation layer.
Figure 8:
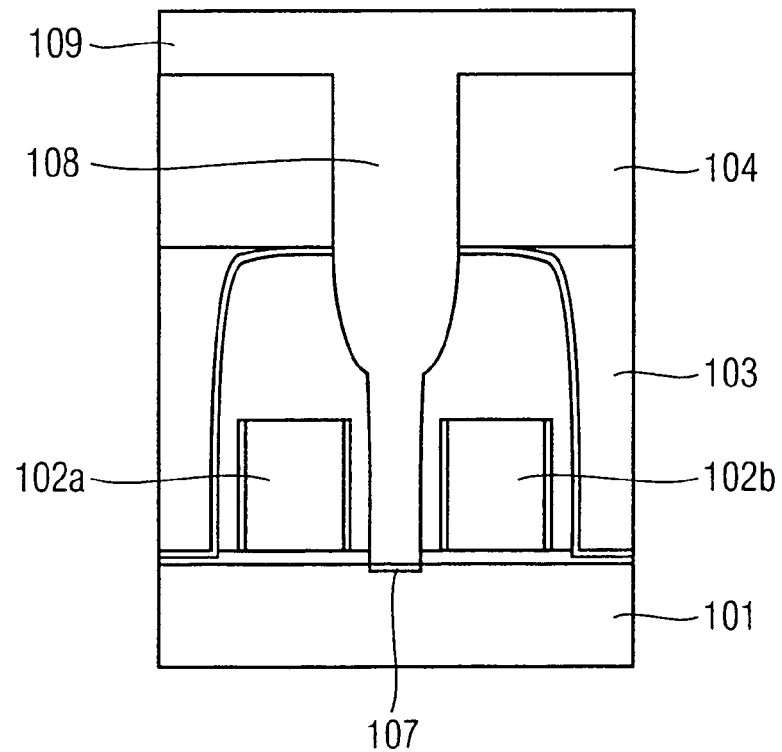
FIG. 8 shows the arrangement of FIG. 6 provided with a contact-making layer on the top side of the insulation layer.
Figure 9:
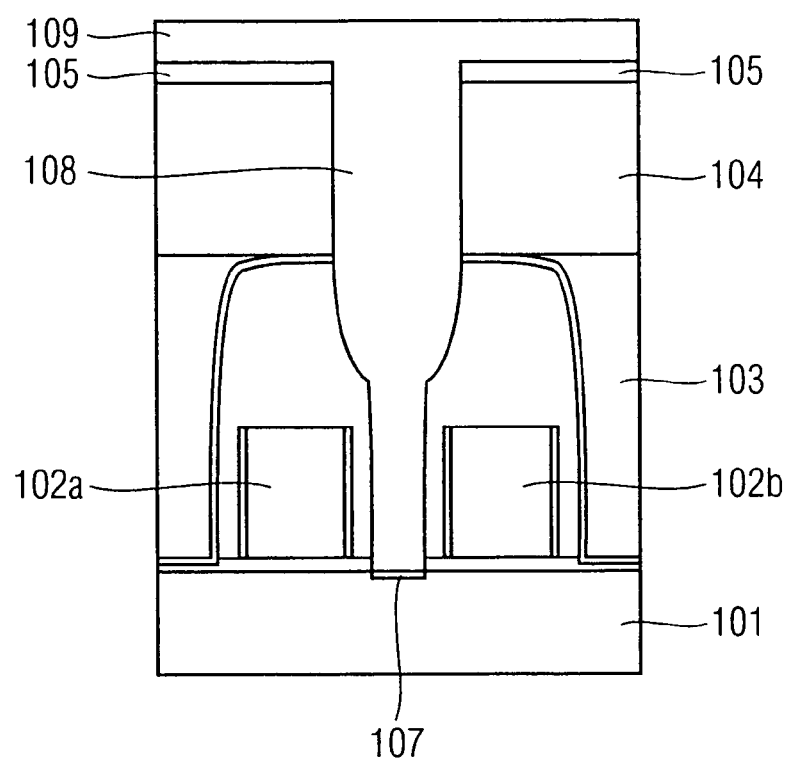
FIG. 9 shows the arrangement of FIG. 7 provided with a contact-making layer on the top side of the masking layer.

FIGS. 8 and 9 show that a contact-making layer 109 has been applied to the arrangements of FIGS. 6 and 7, respectively, the contact-making layer 109 being electrically connected to the through-plating material 108. The layer thickness of the deposited contact-making layer 109 then corresponds to a layer thickness of a metallization plane M, for example a zeroth metallization plane M0, in which interconnects are formed as contact-making connections. In a transition of the process from the states shown in FIG. 8 and FIG. 9 to the states shown in FIG. 10 and FIG. 11, respectively, an antireflection layer (not shown) is applied to the contact-making layer 109 for the purpose of complete planarization and for the purpose of optical decoupling from the base, a metallization plane lithography process subsequently being carried out.

Figure 10:
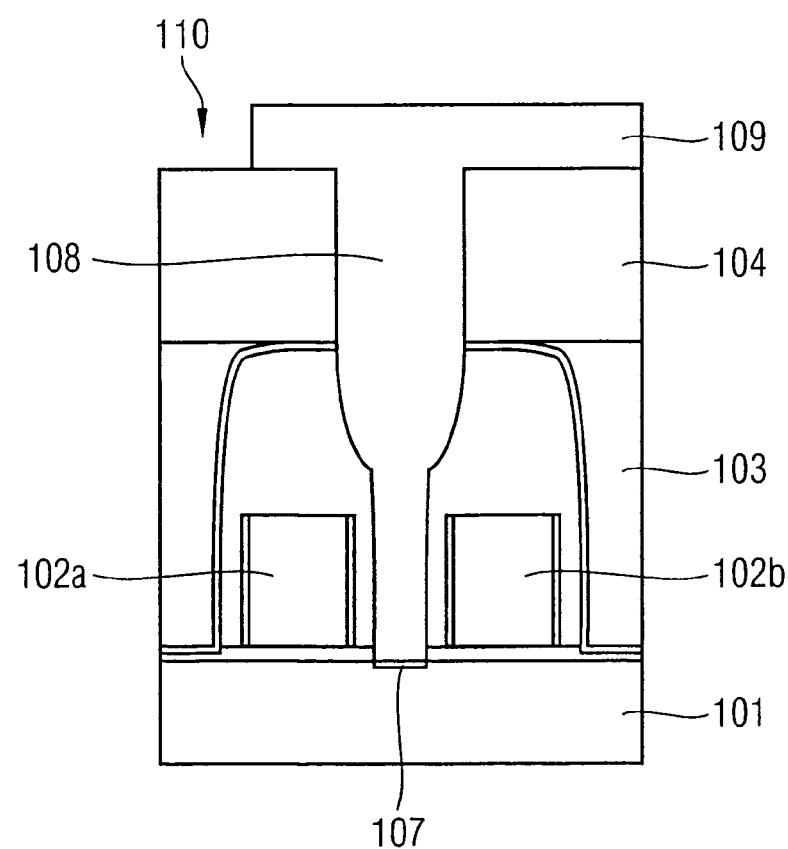
FIG. 10 shows the arrangement shown in FIG. 8, the contact-making layer being patterned in a metallization plane.
Figure 11:
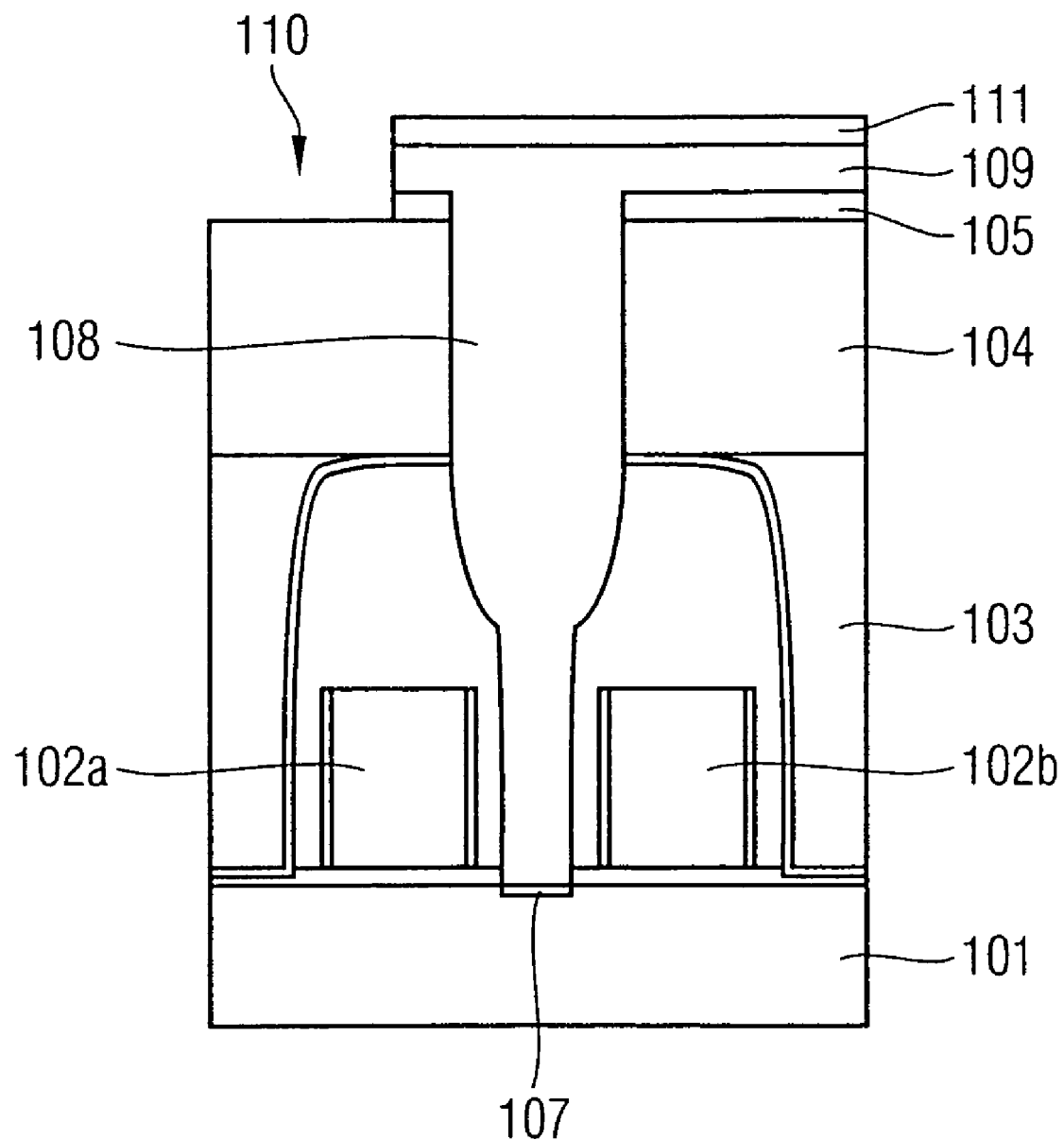
FIG. 11 shows the arrangement of FIG. 9, the contact-making layer being patterned together with the residual masking layer in the metallization plane.

Finally, as shown in FIGS. 10 and 11 at a reference symbol 110, contact-making layer structures are introduced. This is preferably done by applying a further masking layer in the form of a contact-making layer hard mask 111. An etching process then produces the interconnects in the metallization plane M, for example M0 interconnects in the zeroth metallization plane M0.

Furthermore, it is permissible that during the patterning the contact-making layer 109 together with the residual masking layer 105 in accordance with a structure of the contact-making layer mask 111 applied to the contact-making layer 109 in order to form interconnects as contact-making connections in a metallization plane M, provision is made of an overetching into the insulation layer lying below the masking layer 105.

The method according to the invention for fabricating contact-making connections further has the advantage that it is possible to provide for the interspaces of interconnects to be filled with a dielectric having a low dielectric constant, it additionally being possible to produce voids between the interconnects. Consequently, it is expedient that it is possible to choose a design that provides interconnect interspaces that are small in constant fashion everywhere. This affords the advantage that couplings between the interconnects are reduced.

When etching the at least one contact-making hole 112 through the insulation layer 104 and the intermediate layer 103, an aspect ratio between a stack height and a width of a finished contact hole is a critical parameter. According to the invention, it is possible to deposit the insulation layer 104 with a thickness of 100 nm made from TEOS, in which case, in contrast to a so-called dual damascene process such as is known to average persons skilled in the art of coating and etching technology, the interconnects are not etched into the insulation layer 104, but rather are produced on the insulation layer 104. An overall stack height can thus advantageously be reduced.

The use of the RIE process instead of the dual damascene process leads to an advantageous aspect ratio of the arrangement, the masking layer 105 left on the insulation layer 104 enabling a hard polishing stop during a tungsten chemical mechanical polishing.

Although the present invention has been described above on the basis of preferred exemplary embodiments, it is not restricted thereto, but rather can be modified in diverse ways.

Moreover, the invention is not restricted to the application possibilities mentioned.

The invention claimed is:

1. A method for fabricating contact-making connections, comprising:
   a) providing a substrate with electronic circuit units arranged thereon, the substrate having
      an intermediate layer filling an interspace between the electronic circuit units,
      an insulation layer being deposited on the electronic circuit units and on the intermediate layer,
      a masking layer being deposited on the insulation layer, and
      the masking layer being patterned with a through-plating structure;
   b) patterning a contact-making region by means of the masking layer, a contact-making hole being etched through the insulation layer and the intermediate layer as far as the substrate, a section of the substrate being uncovered in accordance with the through-plating structure, and during the patterning provision is made of an overetching into the insulation layer lying below the masking layer;
   c) depositing a covering layer on the uncovered section of the substrate and on the masking layer;
   d) filling the contact-making hole with a through-plating material;
   e) polishing back the covering layer deposited on the masking layer as far as the masking layer;
   f) depositing a contact-making layer on the masking layer and the through-plating material, the contact-making layer being electrically contact-connected with the through-plating material; and
   g) patterning the contact-making layer together with the residual masking layer in accordance with a structure of a contact-making layer mask applied to the contact-making layer to form interconnects as contact-making connections in a metallization plane.

2. The method according to claim 1, wherein in step e) of polishing back the covering layer deposited on the masking layer as far as the masking layer comprises a chemical mechanical polishing that stop on or in the masking layer.

3. The method according to claim 1, wherein the covering layer deposited on the uncovered section of the substrate and on the masking layer is provided from at leaset one of titanium and titanium nitride.

4. The method according to claim 1, wherein the masking layer is provided with a layer thickness such that the masking layer is at least partly preserved during a polishing process for removing the covering layer.

5. The method according to claim 1, wherein the coating and etching processes are carried out in a multiple frequency parallel plate reactor.

6. The method according to claim 1, wherein a process of etching-carried out in step b), the at least one contact-making holethrough the insulation layer, and the intermediate layer as far as the substrate is carried out by means of a reactive ion etching process.

7. The method according to claim 1, wherein a process of etching carried out in step b), the at least one contact-making hole through the insulation layer and the intermediate layer as far as the substrate has a high selectivity with respect to silicon nitride.

8. The method according to claim 1, wherein the insulation layer deposited on the electronic circuit units and on the intermediate layer is provided from a tetraethyl orthosilicate material, a silicon dioxide layer being applied as the insulation layer.

9. The method according to claim 1, wherein the masking layer deposited on the insulation layer is provided as a polysilicon hard mask.

10. The method according to claim 1, wherein the through-plating material and the contact-making layer are formed from a tungsten material.

11. A method for fabricating contact-making connections, comprising:
  a) providing a substrate with electronic circuit units arranged thereon, the substrate having
    an intermediate layer filling an interspace between the electronic circuit units,
    an insulation layer being deposited on the electronic circuit units and on the intermediate layer,
    a masking layer being deposited on the insulation layer, and
    the masking layer being patterned with a through-plating structure;
  b) patterning a contact-making region by means of the masking layer, a contact-making hole being etched through the insulation layer and the intermediate layer as far as the substrate, a section of the substrate being uncovered in accordance with the through-plating structure;
  c) depositing a covering layer on the uncovered section of the substrate and on the masking layer, said covering layer being provided from at least one of titanium and titanium nitride, and forms with the silicon material of the substrate a compound titanium silicide;
  d) filling the contact-making hole with a through-plating material;
  e) polishing back the covering layer deposited on the masking layer as far as the masking layer;
  f) depositing a contact-making layer on the masking layer and the through-plating material, the contact-making layer being electrically contact-connected with the through-plating material; and
  g) patterning the contact-making layer together with the residual masking layer in accordance with a structure of a contact-making layer mask applied to the contact-making layer in order to form interconnects as contact-making connections in a metallization plane.

* * * * *